(12) United States Patent
Yabe (10) Patent No.: US 6,934,349 B2
(45) Date of Patent: Aug. 23, 2005

(54) PHASE DETECTOR AND PHASE LOCKED LOOP CIRCUIT

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 742 days.

(21) Appl. No.: 09/955,131

(22) Filed: Sep. 19, 2001

(65) Prior Publication Data

US 2002/0034274 A1 Mar. 21, 2002

(30) Foreign Application Priority Data

Sep. 19, 2000 (JP) ........................................ 2000-283337

(51) Int. Cl.$^7$ ................................................ H04N 1/36
(52) U.S. Cl. ........................ 375/376; 327/23; 327/141; 327/157
(58) Field of Search ............................ 375/376; 327/23, 327/43, 270, 157, 42; 328/134; 331/1 A, 11

(56) References Cited

U.S. PATENT DOCUMENTS 4,819,081 A * 4/1989 Volk et al. ..................... 327/12

5,705,947 A * 1/1998 Jeong ........................... 327/270

FOREIGN PATENT DOCUMENTS

| JP | 58-164311 | 9/1983 |
| JP | 63-229912 | 9/1988 |
| JP | 2000-13222 | 6/1998 |

* cited by examiner

Primary Examiner—Stephen Chin
Assistant Examiner—Jaison Joseph
(74) Attorney, Agent, or Firm—Banner & Witcoff, Ltd.

(57) ABSTRACT

There is disclosed a phase detector and phase locked loop circuit in which a maximum operation frequency is high. The phase detector of the present invention comprises three S-R flip-flops each of which comprises two NAND gates, a NAND gate connected to an input terminal of the S-R flip-flop, and an inverter. Even when a phase difference between a reference clock signal and a clock signal is large, UP and DOWN signals can be outputted in accordance with the phase difference between both signals, and therefore the maximum operation frequency can be set to be higher than that of a conventional phase detector.

14 Claims, 9 Drawing Sheets

10: PHASE DETECTOR

PHASE DETECTOR AND PHASE LOCKED LOOP CIRCUIT

CROSS REFERENCE TO RELATED APPLICATIONS

This application claims benefit of priority under 35 USC § 119 to Japanese Patent Application No. 2000-283337, filed on Sep. 19, 2000, the entire contents of which are incorporated by reference herein.

BACKGROUND OF THE INVENTION

1. Field of the Invention

The present invention relates to a phase detector for use in a phase locked loop circuit (PLL circuit) and the like which can operate at a high rate even with a low voltage.

2. Related Background Art

A PLL circuit can output a high-precision clock signal with a little frequency fluctuation, and can be constituted by combining a MOS transistor. Therefore, the circuit can broadly be used as a circuit, incorporated in a digital LSI chip, for generating a system clock of CPU, and the like.

The PLL circuit generates a clock signal having the same phase as that of a reference clock signal supplied from the outside. A phase detector for comparing the phase of the reference clock signal with that of the output clock signal of the PLL circuit and outputting a signal in accordance with a phase difference is disposed inside the PLL circuit.

Figure 10:
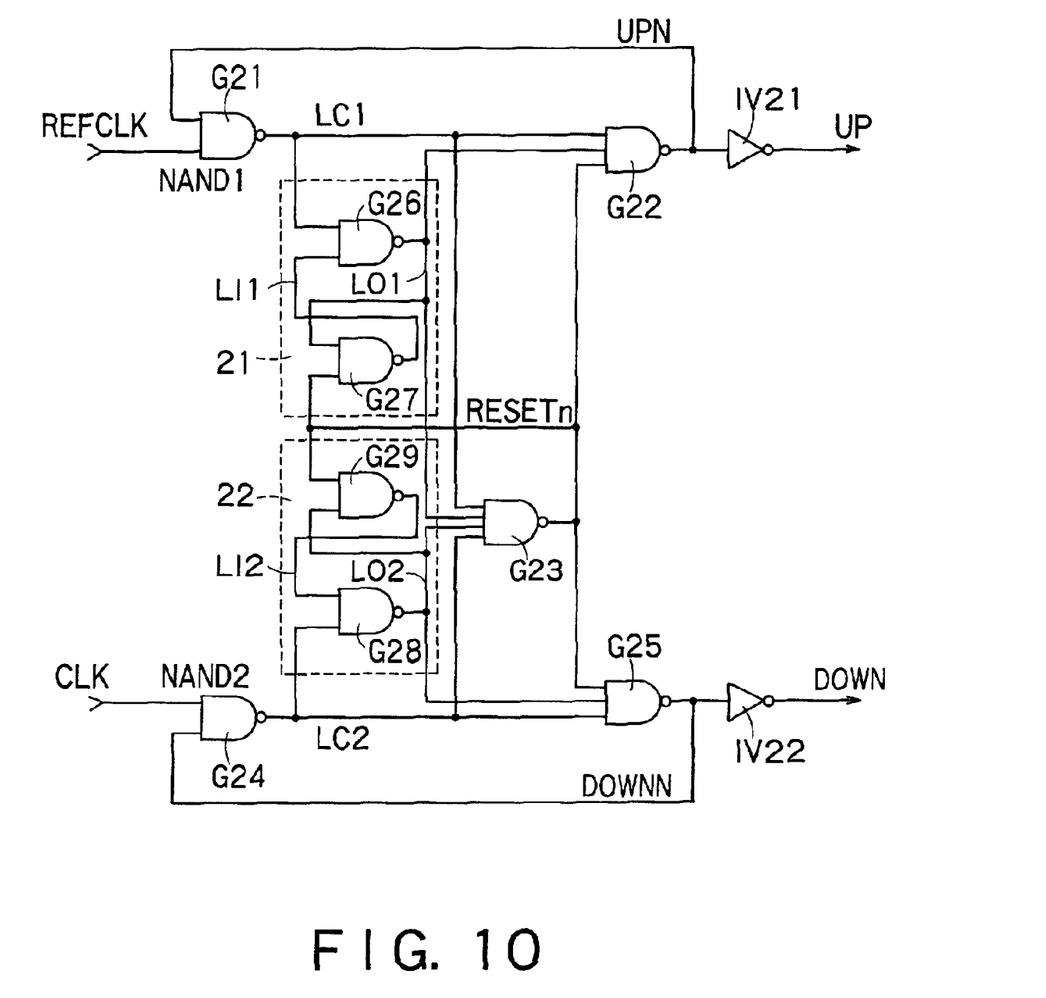
FIG. 10 is a circuit diagram showing the internal constitution of a conventional phase detector.

FIG. 10 is a circuit diagram showing an internal constitution of a conventional phase detector. The phase detector of FIG. 10 comprises two set-reset flip-flops (hereinafter referred to as S-R flip-flops) 21 and 22 each including two NAND gates, NAND gate G21 to G25, and inverters IV21 and IV22.

When an output of the NAND gate G21 has a low level, the S-R flip-flop 21 is brought to a set state. When the output of the NAND gate G24 has the low level, the S-R flip-flop 22 is in the set state. Moreover, when the output of the NAND gate G23 has the low level, both the S-R flip-flops 21 and 22 are brought to a reset state.

Figure 11:
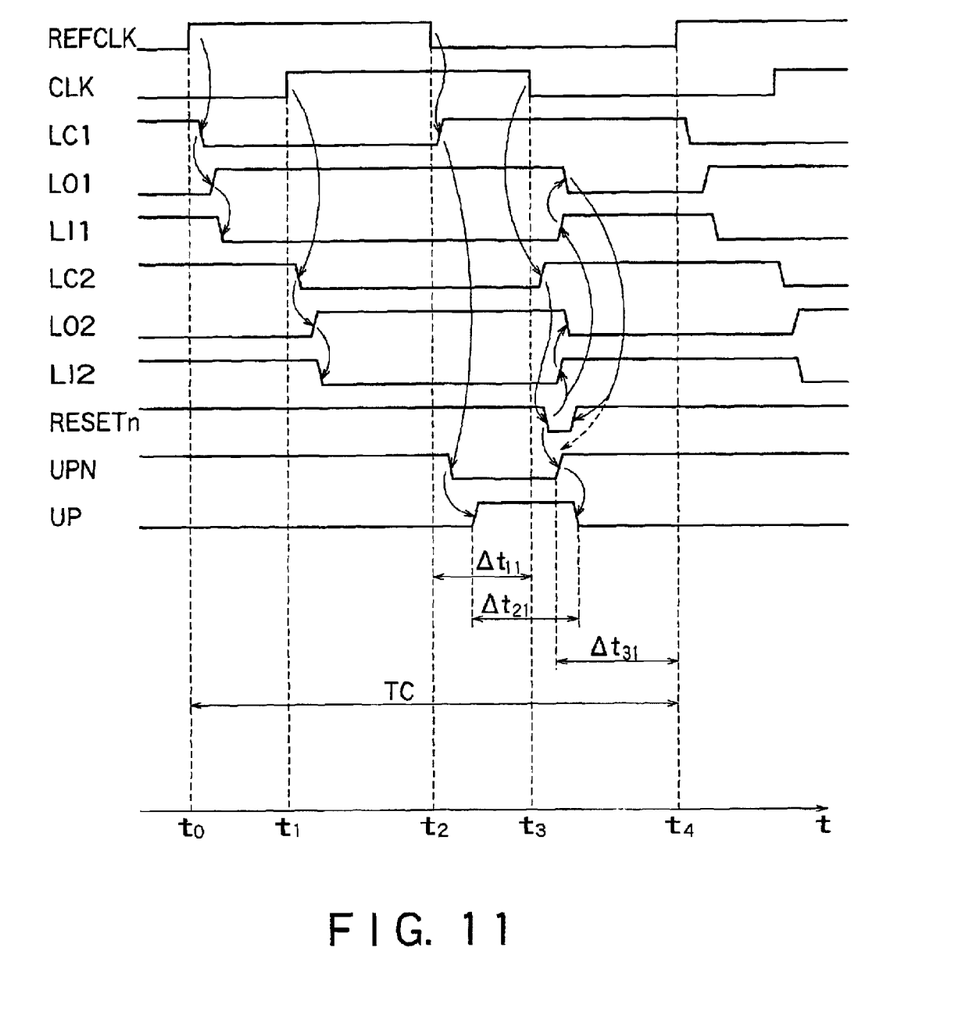
FIG. 11 is an operation timing diagram of the phase detector of FIG. 10.

FIG. 11 is an operation timing diagram of the phase detector of FIG. 10. An operation of the phase detector of FIG. 10 will be described hereinafter with reference to FIG. 11. In an initial state (before time t0), an output UPN of the NAND gate G22 has a high level, and an output RESETn of the NAND gate G23 also has the high level. When a reference clock REFCLK has the high level at the time t0, an output LC1 of the NAND gate G21 has the low level. Thereby, an output LO1 of a NAND gate G26 in the S-R flip-flop 21 reaches the high level, and an output LI1 of a NAND gate G27 reaches the low level.

Thereafter, when a clock signal CLK reaches the high level at time t1, an output LC2 of the NAND gate G24 reaches the low level, subsequently an output LO2 of a NAND gate G28 in the S-R flip-flop 22 reaches the high level, and an output LI2 of a NAND gate G29 reaches the low level.

Thereafter, when the reference clock REFCLK reaches the low level at time t2, the output LC1 of the NAND gate G21 reaches the high level, subsequently the output UPN of the NAND gate G22 reaches the low level, and an output UP of the inverter IV21 reaches the high level.

Subsequently, when the clock signal CLK reaches the low level at time t3, the output LC2 of the NAND gate G24 has the high level. Thereby, the output RESETn of the NAND gate G23 reaches the low level, subsequently the output UPN of the NAND gate G22 reaches the high level, and the output UP of the inverter IV21 reaches the low level.

Thereafter, when the reference clock signal REFCLK reaches the high level at time t4, an operation of time t1 to t4 is repeated.

In FIG. 10, a time difference between when the output UPN of the NAND gate G22 reaches the high level at a falling of the clock signal CLK and when the reference clock signal REFCLK rises to start initialization of the next clock cycle is assumed to be $\Delta t_{31}$. Then, the larger a phase delay time $\Delta t_{11}$ of the clock signal CLK with respect to the reference clock signal REFCLK is, the smaller $\Delta t_{31}$ becomes.

When frequencies of the reference clock signal REFCLK and clock signal CLK increase, $\Delta t_{31}$ decreases and approaches zero. When $\Delta t_{31}$ indicates a negative value, and when the reference clock signal REFCLK rises in the next clock cycle, the output UPN of the NAND gate G22 remains at the low level, the output LC1 of the NAND gate G21 cannot be set to the low level, and normal operation is not realized.

That is, a maximum operation frequency of the conventional phase detector shown in FIG. 10 is defined by the clock frequency at which $\Delta t_{11}$ increases and $\Delta t_{31}$ becomes zero. In a conventional example, when a phase delay of the clock signal CLK is large with respect to the reference clock signal REFCLK, a timing margin from a point of definition of the signal UPN as a previous signal of the signal UP until rising of the reference clock signal REFCLK at a start point of the next cycle is reduced. Therefore, the maximum operation frequency is lowered.

An example in which the phase delay of the clock signal CLK is large with respect to the reference clock signal REFCLK has been described above. However, the similar problem even occurs when the phase delay of the clock signal CLK is small with respect to the reference clock signal REFCLK. In this case, the circuit is initialized not with the reference clock signal REFCLK but with the rising of the clock signal CLK.

SUMMARY OF THE INVENTION

According to the present invention, there is provided a phase detector configured to output an up signal when a first clock signal is ahead of a second clock signal in phase, and outputting a down signal when said first clock signal is behind said second clock signal in phase, said phase detector comprising:

first, second and third flip-flops;

an F/F control circuit configured to set an output state of said first flip-flop based on outputs of said second and third flip-flops, setting the output state of said second flip-flop based on the outputs of said first and third flip-flops, and setting the output state of said third flip-flop based on the outputs of said first and second flip-flops; and an up/down signal output circuit configured to output said up signal and the down signal based on the outputs of said second and third flip-flops.

DESCRIPTION OF THE PREFERRED EMBODIMENTS

A phase detector and phase locked loop circuit (PLL circuit) of the present invention will concretely be described hereinafter with reference to the drawings.

(First Embodiment)

Figure 1:
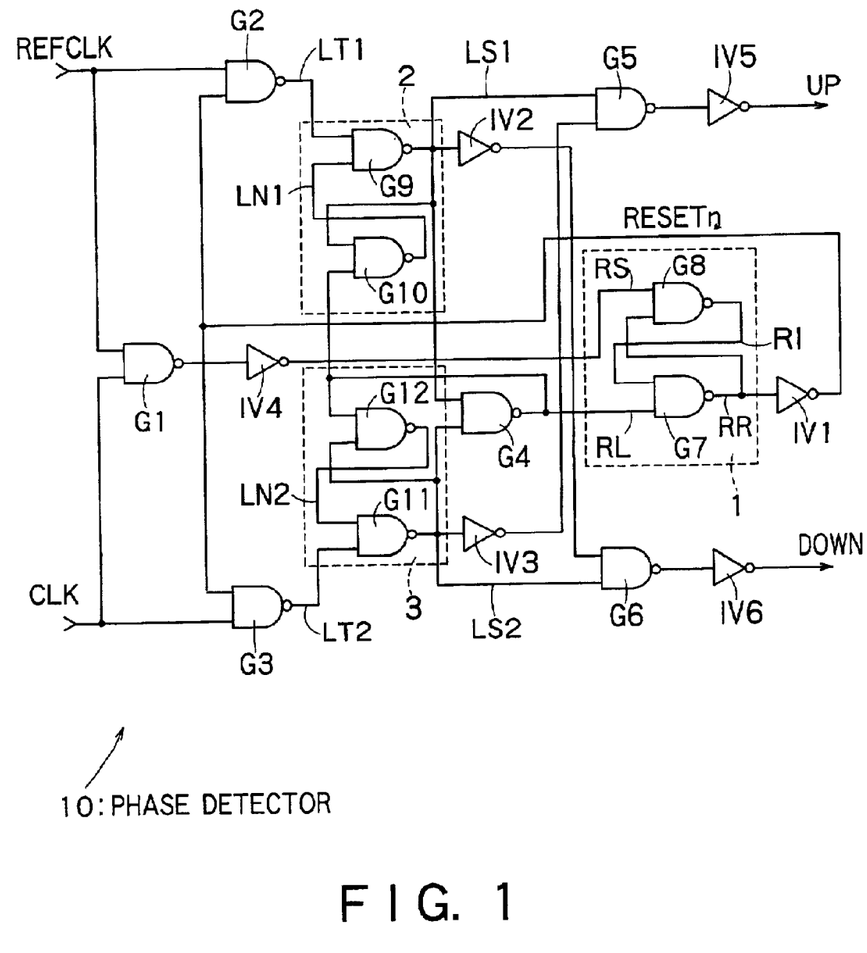
FIG. 1 is a circuit diagram of a first embodiment of a phase detector 10 according to the present invention.

FIG. 1 is a circuit diagram of a first embodiment of a phase detector 10 according to the present invention. The phase detector 10 of FIG. 1 includes three S-R flip-flops 1 to 3 each of which is constituted of two NAND gates, NAND gates G1 to G6, and inverters IV1 to IV6.

The S-R flip-flop 1 has two NAND gates G7 and G8, one NAND gate G7 performs a NAND operation between a set input terminal RL and an output RI of the other NAND gate G8, and the other NAND gate G8 performs the NAND operation between a reset input terminal RS and an output RR of the NAND gate G7. The output of the NAND gate G7 forms the output of the S-R flip-flop 1.

Figure 2:
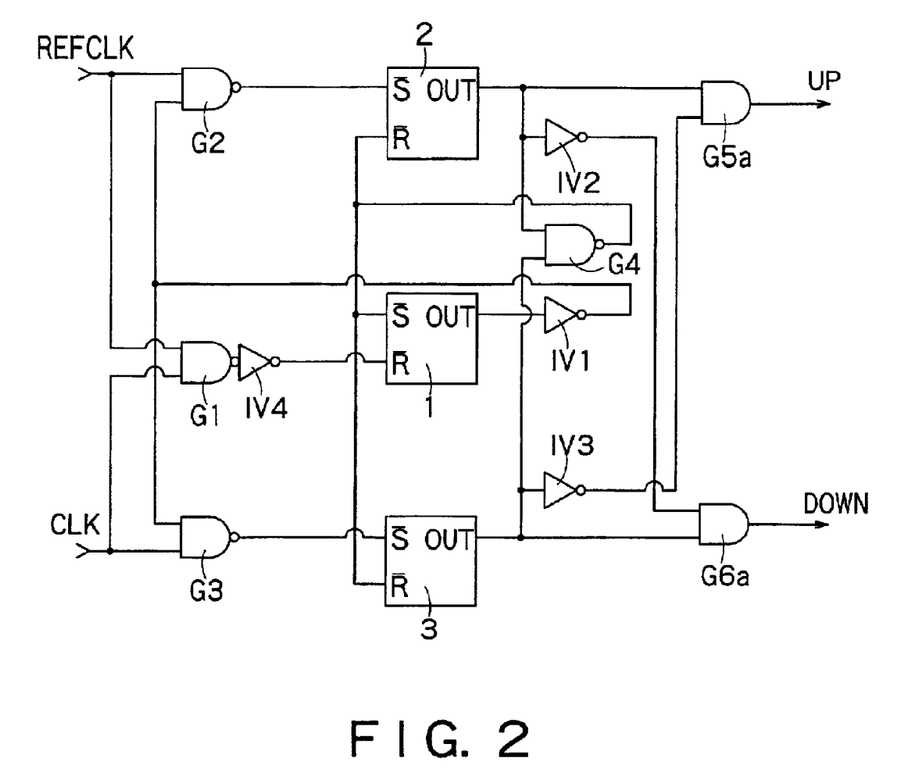
FIG. 2 is an equivalent circuit diagram of FIG. 1.
Figure 3:
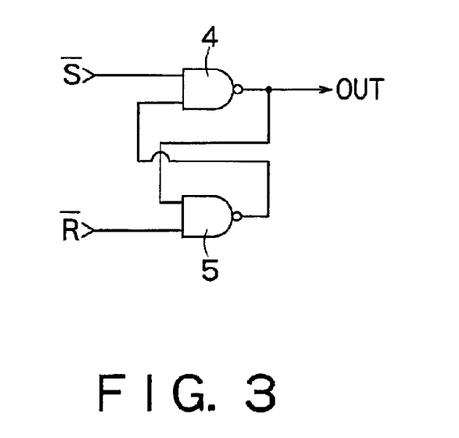
FIG. 3 is a circuit diagram of an S-R flip-flop of FIG. 2.

When the S-R flip-flops 1 to 3 are shown by blocks, the NAND gate G5 and inverter IV5 are replaced with an AND gate G5a, and similarly the NAND gate G6 and inverter IV6 are replaced with an AND gate G6a in the circuit of FIG. 1, the circuit is replaced with a circuit diagram of FIG. 2. An internal constitution of the S-R flip-flops 1 to 3 of FIG. 2 is shown by a circuit of FIG. 3.

The NAND gate G1 of FIG. 2 performs the NAND operation between a reference clock signal REFCLK and a clock signal CLK. More concretely, when at least one of the reference clock signal REFCLK and clock signal CLK has a low level, the NAND gate G1 outputs a high-level signal, and the S-R flip-flop 1 is brought to a reset state.

When the S-R flip-flop 1 is in the reset state, and the reference clock signal REFCLK is at a high level, the NAND gate G2 brings the S-R flip-flop 2 to the set state.

When the S-R flip-flop 1 is in the reset state, and the clock signal CLK is at the high level, the NAND gate G3 brings the S-R flip-flop 3 to the set state.

When both the S-R flip-flops 2 and 3 are in the set state, the NAND gate G4 brings the S-R flip-flops 2 and 3 to the reset state and the S-R flip-flop 1 to the set state.

When the S-R flip-flop 2 is in the set state, and the S-R flip-flop 3 is in the reset state, the AND gate G5a of FIG. 2 outputs a high-level UP signal. When the S-R flip-flop 3 is in the set state, and the S-R flip-flop 2 is in the reset state, the AND gate G6a of FIG. 2 outputs a high-level DOWN signal.

Figure 4:
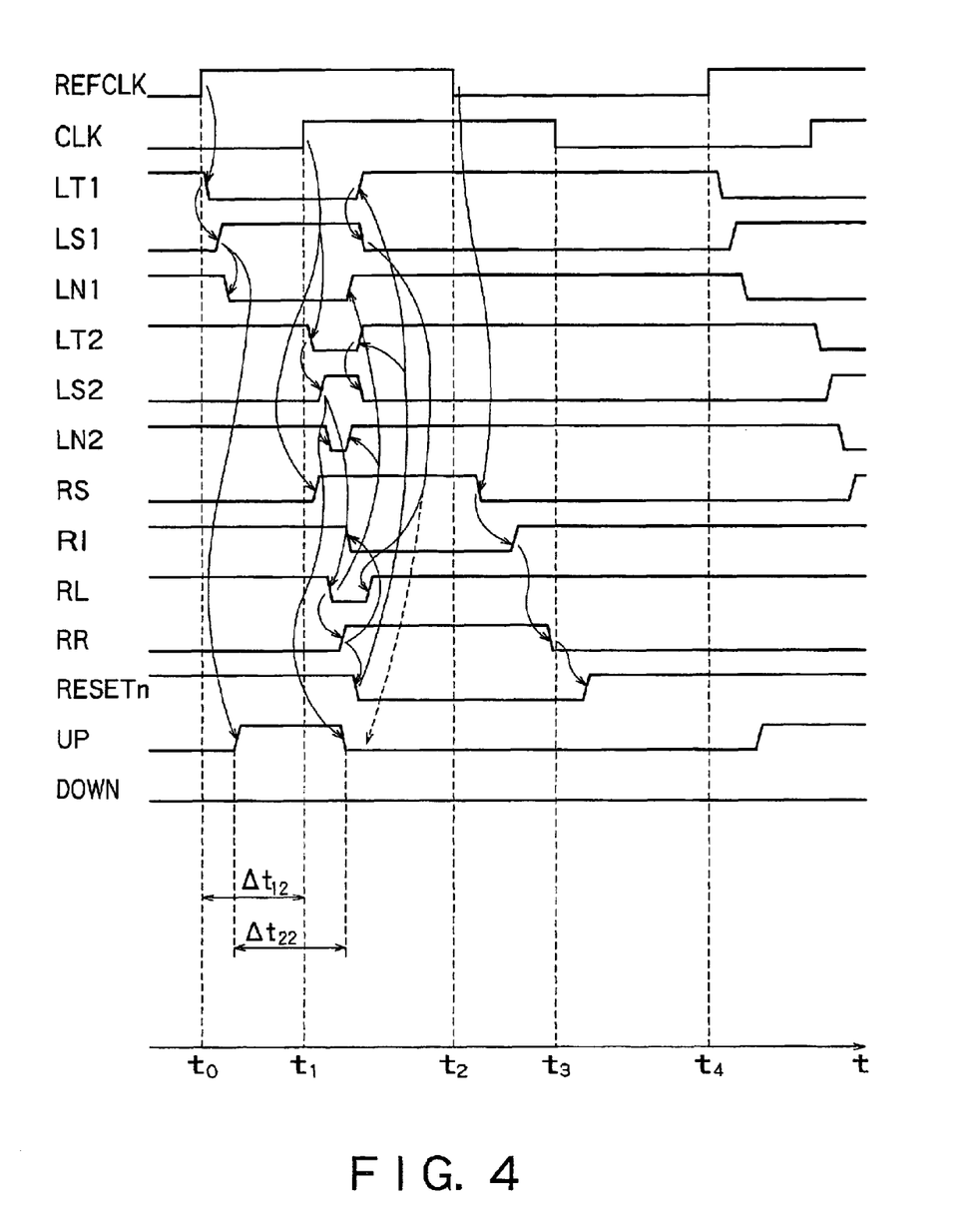
FIG. 4 is an operation timing diagram of the phase detector 10 of FIG. 1.

FIG. 4 is an operation timing diagram of the phase detector 10 of FIG. 1. An operation of the phase detector 10 of FIG. 1 will be described hereinafter with reference to the operation timing diagram of FIG. 4.

Before time t0, an output RESETn of the inverter IV1 has the high level, and NAND gate outputs LN1 and LN2 in the S-R flip-flops 2 and 3 have the high level. When the reference clock signal REFCLK reaches the high level at the time t0, an output LT1 of the NAND gate G2 reaches the low level, and an output LS1 of a NAND gate G9 reaches the high level. Thereby, the output LN1 of a NAND gate G10 reaches the low level, and an output UP of the inverter IV5 reaches the high level.

Thereafter, when the clock signal CLK reaches the high level at time t1, an output LT2 of the NAND gate G3 reaches the low level, and an output RS of the inverter IV4 reaches the high level. When the output LT2 reaches the low level, an output LS2 of a NAND gate G11 reaches the high level, and the output UP of the inverter IV5 reaches the low level.

Moreover, when the output LS2 reaches the high level, an output RL of the NAND gate G4 reaches the low level, an output RR of the S-R flip-flop 1 reaches the high level, and the outputs LN1 and LN2 of the NAND gates G10 and G11 reach the high level.

Furthermore, when the output RR reaches the high level, an output RI reaches the low level, and the output RESETn of the inverter IV1 reaches the low level. When the output RESETn reaches the low level, the outputs LT1 and LT2 of the NAND gates G2 and G3 reach the high level.

When the output LT1 reaches the high level, the output LS1 of the S-R flip-flop 2 reaches the low level, and subsequently the output RL of the NAND gate G4 reaches the high level.

Thereafter, when the reference clock signal REFCLK reaches the low level at time t2, the output RS of the inverter IV4 reaches the low level, subsequently the output RI of the NAND gate G8 in the S-R flip-flop 1 reaches the high level, and the output RR of the NAND gate G7 reaches the low level. As a result, the output RESETn of the inverter IV1 obtains the high level.

In the phase detector 10 of the present embodiment, as compared with the conventional phase detector shown in FIG. 10, even when a phase of the clock signal CLK is far behind the phase of the reference clock signal REFCLK, a rate of an initialization path of the circuit (reference clock signal REFCLK low→output RS low→output RI high→output RR low→output RESETn high) is not determined by a pulse of the UP signal. Therefore, the maximum operation frequency becomes high. This characteristic is particularly important when the phase detector 10 is operated at a low voltage. This is because the phase detector 10 is operated at the low voltage, gate delay is then generated, and the operation frequency tends to be lowered.

Figure 5:
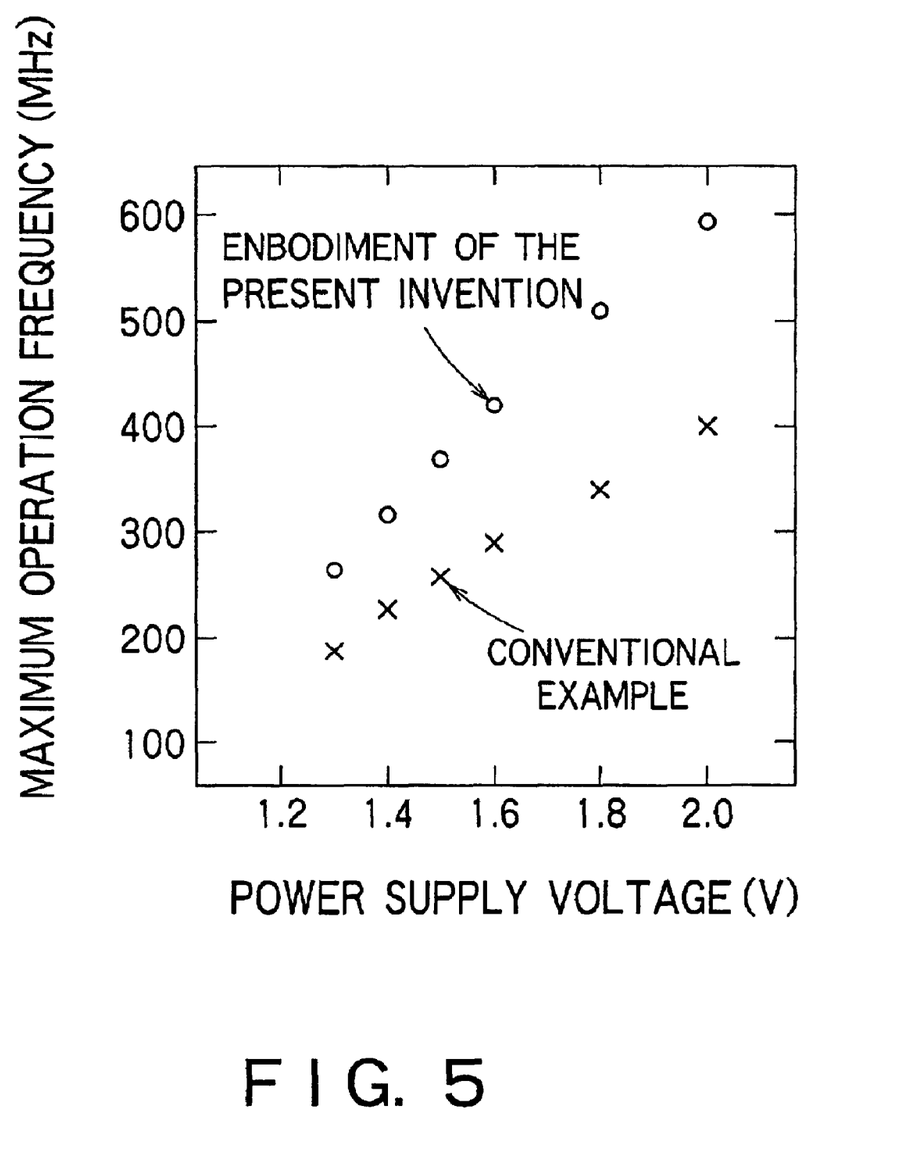
FIG. 5 is a diagram showing a relation between a power source voltage (V) and a maximum operation frequency (MHz).

FIG. 5 is a diagram showing a relation between a power source voltage (V) and the maximum operation frequency (MHz), and shows a circuit simulation result of the maximum operation frequency of the phase detector 10 using a 0.35 μm CMOS technique. In FIG. 5, a circle plot indicates a property of the present embodiment, and a cross plot indicates a conventional property.

As shown in FIG. 5, an operation rate of the present embodiment is higher than that of the conventional example by about 40% at the power source voltage in a range of 1.2 V to 2 V.

Figure 6:
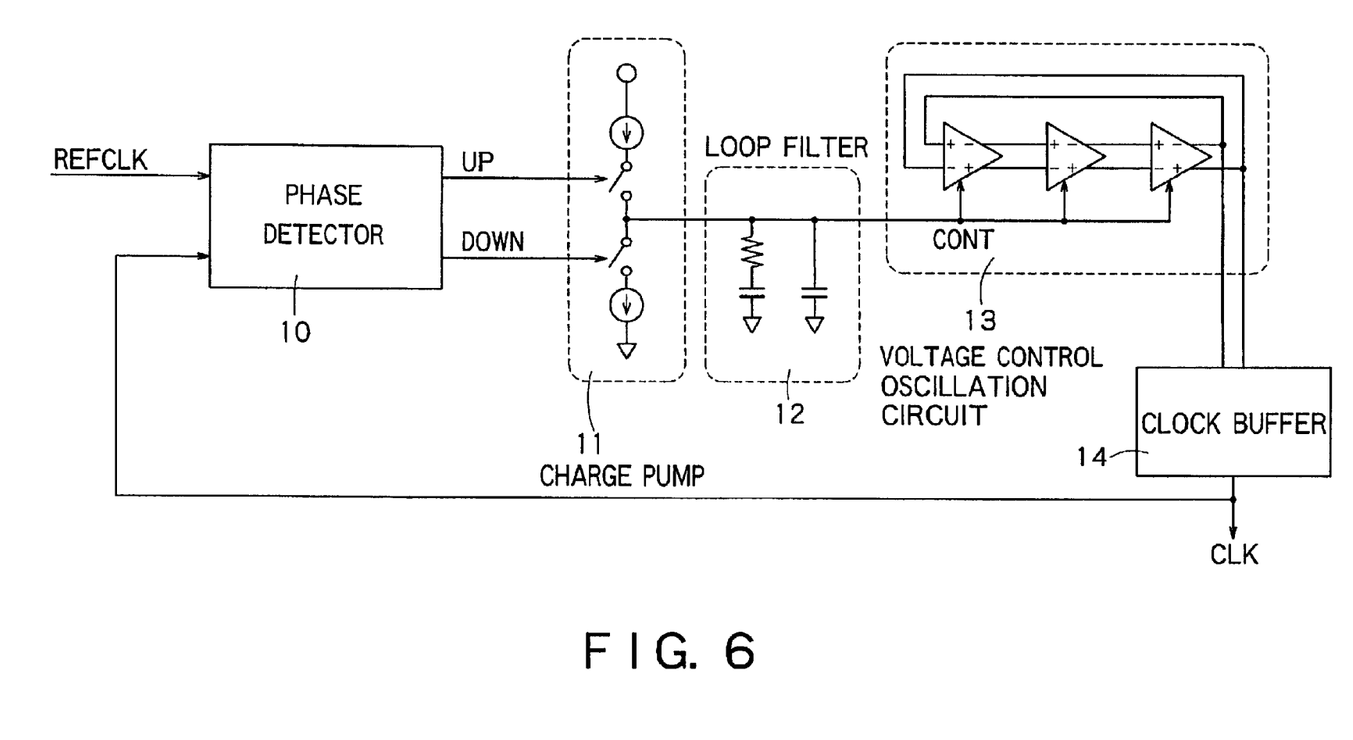
FIG. 6 is a block diagram of a PLL circuit constituted using the phase detector 10 of FIG. 1.

FIG. 6 is a block diagram of the PLL circuit constituted using the phase detector 10 of FIG. 1. The PLL circuit of FIG. 6 includes: a charge pump 11 for outputting a voltage signal in accordance with the UP signal and DOWN signal outputted from the phase detector 10; a loop filter 12 for removing a high frequency component from the voltage signal outputted from the charge pump 11; a voltage control oscillation circuit 13 which oscillates at a frequency in accordance with an output of the loop filter 12; and a clock buffer 14, connected to an output terminal of the voltage control oscillation circuit 13, for outputting the clock signal CLK.

Additionally, as omitted from FIG. 6, a signal constituted by frequency-dividing the clock signal CLK outputted from the clock buffer 14 may be supplied to the phase detector 10 and compared in phase with the reference clock signal.

Figure 7A:
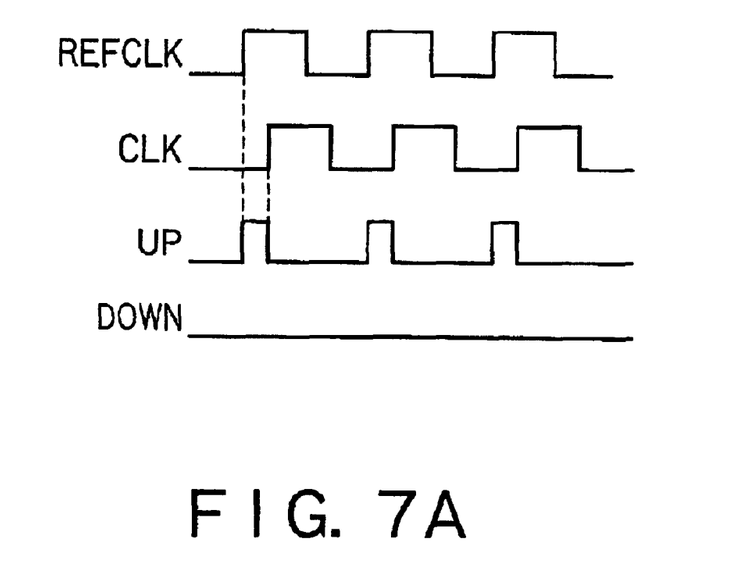
FIG. 7 is an operation timing diagram of the PLL circuit of FIG. 6.
Figure 7B:
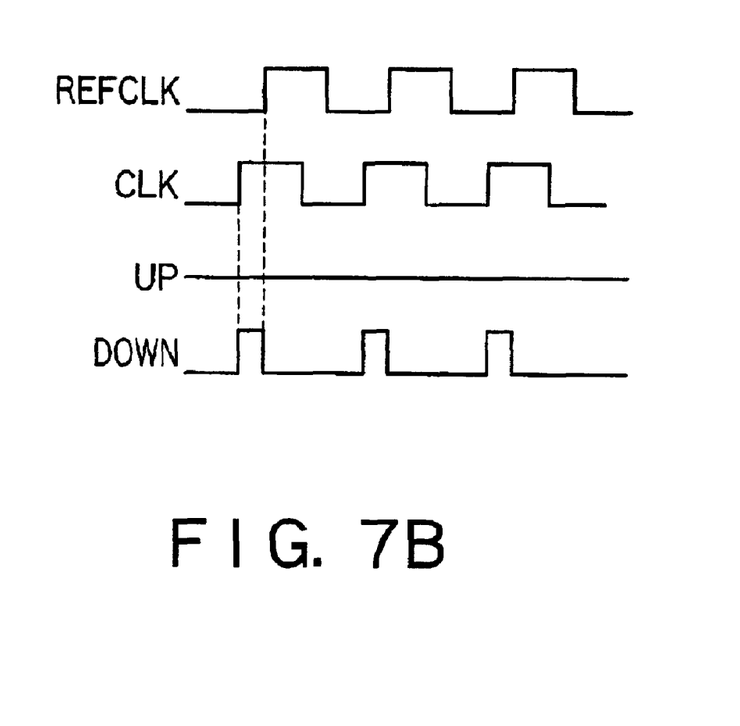

FIG. 7 is an operation timing diagram of the PLL circuit of FIG. 6, FIG. 7A shows that the phase of the reference clock signal REFCLK is ahead of the phase of the clock signal CLK, and FIG. 7B shows that the phase of the reference clock signal REFCLK is behind the phase of the clock signal CLK.

In FIG. 7A, the phase detector 10 outputs the high-level UP signal, and the charge pump 11 causes the output voltage to go up. On the other hand, in FIG. 7B, the phase detector 10 outputs the high-level DOWN signal, and the charge pump 11 causes the output voltage to go down.

The phase detector 10 of the present embodiment sets the respective outputs of three flip-flops 1 to 3 for controlling generation of the UP and DOWN signals without being directly related to logic of the UP and DOWN signals. Therefore, the UP and DOWN signals can correctly be outputted in accordance with the phase difference between the reference clock signal REFCLK and the clock signal CLK regardless of a magnitude of the phase difference between both signals.

That is, according to the first embodiment, even when the phase difference between the reference clock signal REFCLK and the clock signal CLK is large, the UP and DOWN signals can correctly be outputted, and the maximum operation frequency can therefore be set to be higher than a conventional maximum operation frequency.

(Second Embodiment)

A second embodiment is different from the first embodiment in logic of a set input terminal and reset input terminal of the S-R flip-flop.

Figure 8:
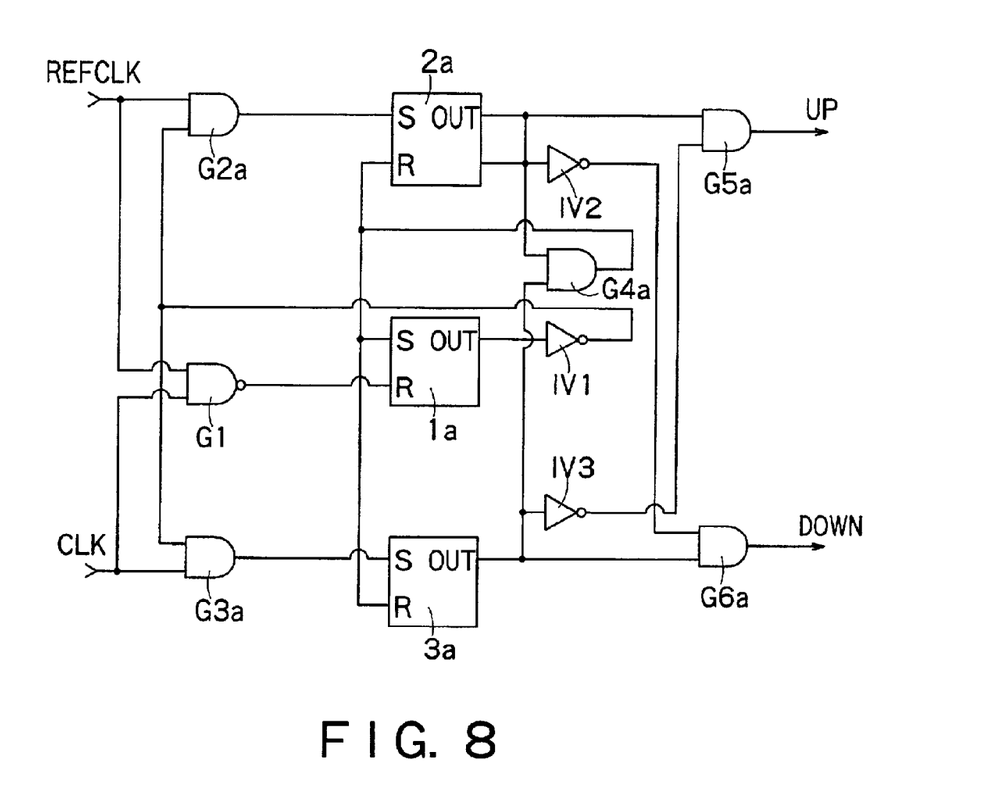
FIG. 8 is a circuit diagram of a second embodiment of the phase detector 10 according to the present invention.

FIG. 8 is a circuit diagram of the second embodiment of the phase detector 10 according to the present invention. The phase detector 10 of FIG. 8 includes three S-R flip-flops 1a, 2a and 3a in which the set and reset input terminals have a positive logic, AND gates G2a, G3a, G4a, G5a and G6a, NAND gate G1, and inverters IV1 to IV3.

The S-R flip-flop 1a is brought to the reset state when the output of the NAND gate G1 has the high level, and is brought to the set state when the output of the AND gate G4a has the high level.

The S-R flip-flop 2a is brought to the set state when the output of the AND gate circuit G2a has the high level, and is brought to the reset state when the output of the AND gate circuit G4a has the high level.

The S-R flip-flop 3a is brought to the set state when the output of the AND gate circuit G3a has the high level, and is brought to the reset state when the output of the AND gate circuit G4a has the high level.

Figure 9:
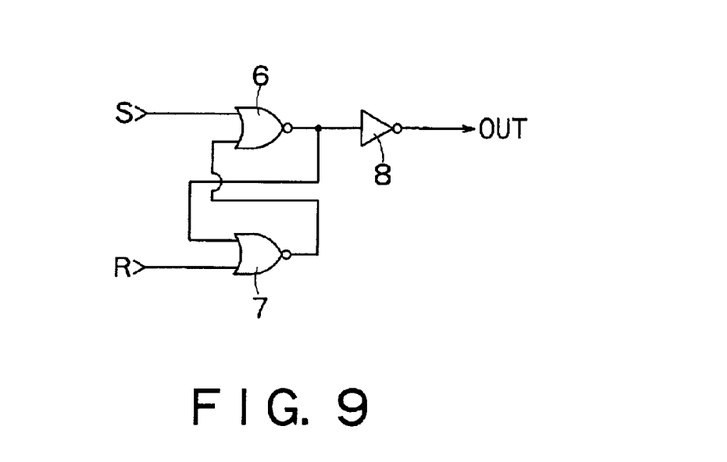
FIG. 9 is a circuit diagram showing an internal constitution of the S-R flip-flop of FIG. 8.

FIG. 9 is a circuit diagram showing an internal constitution of the S-R flip-flop of FIG. 8. As shown in FIG. 9, each of the S-R flip-flops 1a, 2a and 3a has NOR gates 6, 7 and inverter 8. The NOR gate 6 performs a NOR operation between the set input terminal and the output terminal of the NOR gate 7, the NOR gate 7 performs the NOR operation between the reset input terminal and the output terminal of the NOR gate 6, the inverter 8 reverses the output of the NOR gate 6, and the output of the inverter 8 forms the output of each flip-flop.

Also in the second embodiment, even when the phase difference between the reference clock signal REFCLK and the clock signal CLK is large, the UP and DOWN signals can correctly be outputted, and therefore the maximum operation frequency can be set to be high.

In the aforementioned first embodiment, an example in which the NAND gate and inverter are combined to constitute the phase detector 10 has been described. In the second embodiment, an example in which the NAND gate, AND gate and inverter are combined to constitute the phasedetector 10 has been described. However, the type of the gate constituting the phase detector 10 is not particularly limited.

What is claimed is:

1. A phase detector configured to output an up signal when a first clock signal is ahead of a second clock signal in phase, and outputting a down signal when said first clock signal is behind said second clock signal in phase, said phase detector comprising: first, second, and third flip-flops; a flip-flop (F/F) control circuit which brings said first flip-flop to a reset state when at least one of said first and second clock signals has a first logic, brings said first flip-flop to a set state when both said second and third flip-flops are in the set state, brings said second flip-flop to the se state when said first clock signal has a second logic and said first flip-flop is in the reset state, brings said second flip-flop to the reset state when both said second and third flip-flop are in set state, brings said third flip-flop to the set state when said second clock signal has a second logic ad said first flip-flop is in reset state, and brings said third flip-flop to the reset state when both said second and third flip-flops are in the set state; and an up-down signal output circuit configured to output said up signal and down signal based on the outputs of said second and third flip-flops.

2. The phase detector according to claim 1 wherein said flip-flop (F/F) control circuit comprises: a first logic circuit configured to reset said first flip-flop when at least one of said first and second clock signals has said first logic; a second logic circuit configured t bring said second flip-flop to the set state when said flip-flop is in the reset state and said first clock signal had said second logic; a third logic circuit configured to bring said third flip-flop to the set state when said first flip-flop is in the reset state and said second clock signal has said second logic; a fourth logic circuit configured to bring said second and third flip-flop to the reset state when said second and third flip-flops are in the set state; a fifth logic circuit configured to output an up signal when said second flip-flop is in the set state and third flip-flop is in the reset state; and a sixth logic circuit configured to output said down signal when said third flip-flop is in the set state and said second flip-flop is in the reset state.

3. The phase detector according to claim 2 wherein said first flip-flop is brought to the reset state when an output of said first logic circuit has the first logic, and brought to the set state when the output of said fourth logic circuit has said first logic;

said second flip-flop is brought to the set state when the output of said second logic circuit has said first logic, and brought to the reset state when the output of said fourth logic circuit has said first logic, and said third flip-flop is brought to the set state when the output of said third logic circuit has said first logic, and brought to the reset state when the output of said fourth logic circuit has said first logic.

4. The phase detector according to claim 3 wherein each of said first, second and third flip-flops comprises a set input terminal, a reset input terminal, and first and second NAND gates, said first NAND gate performs a NAND operation between the set input terminal and an output terminal of said second NAND gate, said second NAND gate performs the NAND operation between the reset input terminal and the output terminal of said first NAND gate, and the output of said first NAND gate forms respective outputs of said corresponding first, second and third flip-flops.

5. The phase detector according to claim 3 wherein said first logic is a high level, and said second logic is a low level.

6. The phase detector according to claim 2 wherein said first flip-flop is brought to the reset state when an output of said first logic circuit has said second logic, and brought to the set state when the output of said fourth logic circuit has said second logic;

said second flip-flop is brought to the set state when the output of said second logic circuit has said second logic, and brought to the reset state when the output of said fourth logic circuit has said second logic, and said third flip-flop is brought to the set state when the output of said third logic circuit has said second logic, and brought to the reset state when the output of said fourth logic circuit has said second logic.

7. The phase detector according to claim 6 wherein each of said first, second and third flip-flops comprises a set input terminal, a reset input terminal, first and second NOR gates, and an inverter, said first NOR gate performs a NOR operation between the set input terminal and an output terminal of said second NOR gate, said second NOR gate performs the NOR operation between the reset input terminal and the output terminal of said first NOR gate, said inverter reverses an output of said first NOR gate, and the output of said inverter forms respective outputs of said corresponding first, second and third flip-flops.

8. The phase detector according to claim 6 wherein said first logic is a high level, and said second logic is a low level.

9. A phase locked loop circuit comprising: a charge pump configured to output a voltage signal in accordance with an up signal and a down signal; a loop filter configured to remove a high frequency component included in the an output of said charge pump; a voltage control oscillation circuit configured to output a signal of a frequency in accordance with output voltage of said loop filter; a clock buffer configured to output a clock signal in accordance with an output of said voltage control oscillation circuit; and a phase detector configured to output the up signal when a first clock signal is ahead of a second clock signal in phase, and outputting a down signal when said first clock signal is behind said second clock signal in phase, wherein said phase detector comprises: first, second, and third flip-flops; a flip-flop (F/F) control circuit which brings said first flip-flop to a reset state when at least one of said first and second clock signals has a first logic, brings said first flip-flop to a set state when both said second and third flip-flops are in the set state, brings said second flip-flop to the set state when said first clock signal has a second logic and said first flip-flop is in the reset state, brings said second flip-flop to the reset state when both said second and third flip-flop are in set state, brings said third flip-flop to the set state when said second clock signal has a second logic ad said first flip-flop is in reset state, and brings said third flip-flop to the reset state when both said second and third flip-flops are in the set state; and an up-down signal output circuit configured to output said up signal and down signal based on the outputs of said second and third flip-flops.

10. The phase locked loop circuit according to claim 1 wherein said flip-flop (F/F) control circuit comprises: a first logic circuit configured to reset said first flip-flop when at least one of said first and second clock signals has said first logic; a second logic circuit configured t bring said second flip-flop to the set state when said flip-flop is in the reset state and said first clock signal had said second logic; a third logic circuit configured to bring said third flip-flop to the set state when said first flip-flop is in the reset state and said second clock signal has said second logic; a fourth logic circuit configured to bring said second and third flip-flop to the reset state when said second and third flip-flops are in the set state; a fifth logic circuit configured to output an up signal when said second flip-flop is in the set state and third flip-flop is in the reset state; and a sixth logic circuit configured to output said down signal when said third flip-flop is in the set state and said second flip-flop is in the reset state.

11. The phase locked loop circuit according to claim 10 wherein said first flip-flop is brought to the reset state when an output of said first logic circuit has the first logic, and brought to the set state when the output of said fourth logic circuit has said first logic;

said second flip-flop is brought to the set state when the output of said second logic circuit has said first logic, and brought to the reset state when the output of said fourth logic circuit has said first logic, and said third flip-flop is brought to the set state when the output of said third logic circuit has said first logic, and brought to the reset state when the output of said fourth logic circuit has said first logic.

12. The phase locked loop circuit according to claim 11 wherein each of said first, second and third flip-flops comprises a set input terminal, a reset input terminal, and first and second NAND gates, said first NAND gate performs a NAND operation between the set input terminal and an output terminal of said second NAND gate, said second NAND gate performs the NAND operation between the reset input terminal and the output terminal of said first NAND gate, and the output of said first NAND gate forms respective outputs of said corresponding first, second and third flip-flops.

13. The phase locked loop circuit according to claim 10 wherein said first flip-flop is brought to the reset state when an output of said first logic circuit has said second logic, and brought to the set state when the output of said fourth logic circuit has said second logic;

said second flip-flop is brought to the set state when the output of said second logic circuit has said second logic, and brought to the reset state when the output of said fourth logic circuit has said second logic, and said third flip-flop is brought to the set state when the output of said third logic circuit has said second logic, and brought to the reset state when the output of said fourth logic circuit has said second logic.

14. The phase locked loop circuit according to claim 13 wherein each of said first, second and third flip-flops comprises a set input terminal, a reset input terminal, first and second NOR gates, and an inverter, said first NOR gate performs a NOR operation between the set input terminal and an output terminal of said second NOR gate, said second NOR gate performs the NOR operation between the reset input terminal and the output terminal of said first NOR gate, said inverter reverses an output of said first NOR gate, and the output of said inverter forms respective outputs of said corresponding first, second and third flip-flops.

* * * * *

UNITED STATES PATENT AND TRADEMARK OFFICE
CERTIFICATE OF CORRECTION

PATENT NO. : 6,934,349 B2
DATED : August 23, 2005
INVENTOR(S) : Tomoaki Yabe

It is certified that error appears in the above-identified patent and that said Letters Patent is hereby corrected as shown below:

<u>Column 6,</u>
Line 12, replace "the se state" with -- the set state --.
Line 16, replace "logic ad said" with -- logic and said --.
Line 26, replace "configured t bring" with -- configured to bring --.

<u>Column 7,</u>
Line 49, replace "logic ad said" with -- logic and said --.
Line 59, replace "configured t bring" with -- configured to bring --.

Signed and Sealed this

Thirteenth Day of June, 2006

JON W. DUDAS
*Director of the United States Patent and Trademark Office*